United States Patent
Matsushita et al.

(10) Patent No.: US 8,604,338 B2
(45) Date of Patent: *Dec. 10, 2013

(54) SOLAR CELL

(75) Inventors: Akio Matsushita, Kyoto (JP); Akihiro Itoh, Kyoto (JP); Tohru Nakagawa, Shiga (JP); Hidetoshi Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 14 days.

This patent is subject to a terminal disclaimer.

(21) Appl. No.: 13/469,794

(22) Filed: May 11, 2012

(65) Prior Publication Data

US 2012/0247555 A1 Oct. 4, 2012

Related U.S. Application Data

(63) Continuation of application No. PCT/JP2011/005870, filed on Oct. 20, 2011.

(30) Foreign Application Priority Data

Mar. 24, 2011 (JP) ................................. 2011-065556

(51) Int. Cl.
*H01L 31/00* (2006.01)
(52) U.S. Cl.
USPC ........................ 136/262; 136/252; 136/259
(58) Field of Classification Search
USPC ......... 136/205, 206, 214, 215, 244, 246, 247, 136/252
See application file for complete search history.

(56) References Cited

U.S. PATENT DOCUMENTS

| | | | |
|---|---|---|---|
| 4,834,805 A | 5/1989 | Erbert | |
| 8,138,002 B2 * | 3/2012 | Yashima et al. | 438/40 |
| 8,193,078 B2 * | 6/2012 | Pan | 438/500 |
| 2003/0015700 A1 * | 1/2003 | Eisenbeiser et al. | 257/53 |
| 2010/0089440 A1 * | 4/2010 | Gray et al. | 136/255 |
| 2010/0326496 A1 * | 12/2010 | Bhattacharya et al. | 136/249 |
| 2010/0326518 A1 * | 12/2010 | Juso et al. | 136/256 |
| 2011/0005570 A1 * | 1/2011 | Jain | 136/244 |
| 2012/0301993 A1 * | 11/2012 | Matsushita et al. | 438/69 |

FOREIGN PATENT DOCUMENTS

| | | |
|---|---|---|
| JP | 55-040560 | 3/1980 |
| JP | 58-068988 | 4/1983 |
| JP | 01-094677 | 4/1989 |
| JP | 2008-124381 | 5/2008 |

OTHER PUBLICATIONS

Jenny Nelson, :The Physics of Solar Cells, World Scientific Pub. Co., Inc., pp. 11-13.
International Search Report issued in International Patent Application No. PCT/JP2011/005870 filed Oct. 20, 2011.

* cited by examiner

*Primary Examiner* — Susan D Leong
(74) *Attorney, Agent, or Firm* — McDermott Will & Emery LLP

(57) ABSTRACT

A method for generating electric power with use of a solar cell includes steps of: (a) preparing the solar cell including a condensing lens and a solar cell element, wherein the following inequation set (I) is satisfied: $d2<d1$, $d3<d1$, 1 nanometer$\leq d2 \leq 4$ nanometers, 1 nanometer$\leq d3 \leq 4$ nanometers, 100 nanometers$\leq w2$, and 100 nanometers$\leq w3$ . . . (I); and (b) irradiating a region S which is included in the surface of the p-type window layer through the condensing lens with light in such a manner that the following inequation (II) is satisfied so as to generate a potential difference between the n-side electrode (110) and the p-side electrode (109): $w4 \leq w1$ . . . (II).

6 Claims, 7 Drawing Sheets

SOLAR CELL

This is a continuation of International Application No. PCT/JP2011/005870, with an international filing date of Oct. 20, 2011, which claims priority of Japanese Patent Application No. 2011-065556, filed on Mar. 24, 2011, the contents of which are hereby incorporated by reference.

TECHNICAL FIELD

The present invention relates to a solar cell.

BACKGROUND ART

FIG. 7 shows a solar cell disclosed in Patent Literature 1. The conventional solar cell comprises a plurality of photoelectric conversion layers 13, the photoelectric conversion layer 13 having a solar cell element 11 and a lens L. The solar cell element 11 comprises a p-type GaAs buffer layer 13a, a p-type InGaP-BSF layer 13b, a p-type GaAs base layer 13c, an n-type GaAs emitter layer 13d, an n-type InGaP window layer 13e, and an antireflection layer 15. These layers 13a to 15 are stacked on a semiconductor substrate 12 in this order. The solar cell element 11 further comprises a separation grid 16 which separates the photoelectric conversion layer 13, a contact layer 14 around the detector side of the photoelectric conversion layer 13, a recoupling prevention layer 17 around the outer circumference of the contact layer 14, a detector side electrode 18 and a back side electrode 19.

Sunlight penetrates the lens L and the antireflection layer 15, and the n-type InGaP window layer 13e is irradiated with the sunlight. This irradiation of the sunlight generates electric power.

CITATION LIST

Patent Literature

[Patent Literature 1]
Japanese Laid-Open Patent Application Publication No. 2008-124381

Non Patent Literature

[Non Patent Literature 1]
Jenny Nelson, "The Physics of Solar Cells", World Scientific Pub Co Inc.

SUMMARY OF THE INVENTION

Technical Problem

The conventional solar cell has a conversion efficiency of approximately 20%.

The purpose of the present invention is to provide a solar cell with higher conversion efficiency.

Solution to Problems

The present disclosure provides a method for generating electric power with use of a solar cell, the method comprising steps of:

(a) preparing the solar cell comprising a condensing lens and a solar cell element, wherein
the solar cell element comprises an n-type GaAs layer, a p-type GaAs layer, a p-type window layer, an n-side electrode, and a p-side electrode;

a Z-direction denotes the direction of the normal line of the p-type GaAs layer;

an X-direction denotes a direction orthogonal to the Z-direction, the n-type GaAs layer, the p-type GaAs layer, and the p-type window layer are stacked along the Z-direction;

the p-type GaAs layer is interposed between the n-type GaAs layer and the p-type window layer along the Z-direction;

the p-side electrode is electrically connected with the p-type GaAs layer;

the n-side electrode is electrically connected with the n-type GaAs layer;

the n-type GaAs layer is divided into a center part, a first peripheral part, and a second peripheral part;

the center part is interposed between the first peripheral part and the second peripheral part along the X-direction;

the first peripheral part and the second peripheral part have a shape of a layer, the following inequation set (I) is satisfied:

$$d2<d1, d3<d1, 1 \text{ nanometer} \leq d2 \leq 4 \text{ nanometers}, 1 \text{ nanometer} \leq d3 \leq 4 \text{ nanometers}, 100 \text{ nanometers} \leq w2, \text{ and } 100 \text{ nanometers} \leq w3 \quad (I);$$

wherein $d1$ represents a thickness of the center part along the Z-direction;

$d2$ represents a thickness of the first peripheral part along the Z-direction;

$d3$ represents a thickness of the second peripheral part along the Z-direction;

$w2$ represents a width of the first peripheral part along the X-direction; and $w3$ represents a width of the second peripheral part along the X-direction; and (b) irradiating a region S which is included in the surface of the p-type window layer through the condensing lens with light in such a manner that the following inequation (II) is satisfied so as to generate a potential difference between the n-side electrode and the p-side electrode:

$$w4 \leq w1 \quad (II);$$

wherein $w1$ represents a width of the center part along the X-direction;

$w4$ represents a width of the region S along the X-direction in the cross-sectional view which includes the Z-direction; and the first center part overlaps the region S when seen from the Z-direction.

Advantageous Effect of the Invention

The present invention provides a solar cell with higher conversion efficiency.

DESCRIPTION OF EMBODIMENTS

The embodiment of the present invention is described below with reference to drawings.

Embodiment 1

Step (a)

In the step (a), a solar cell is prepared.

Figure 1A:
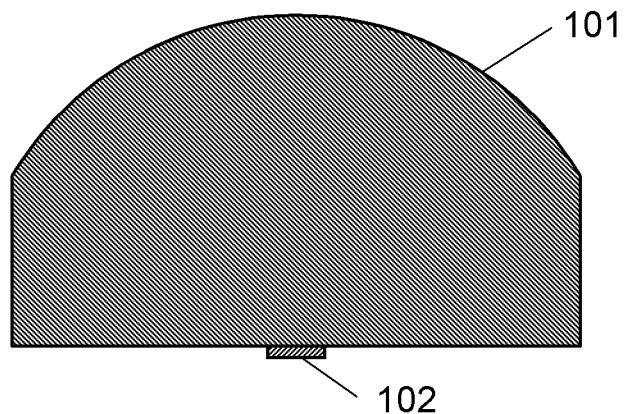
FIG. 1A shows a cross-sectional view of the solar cell according to the embodiment 1.

FIG. 1A shows a cross-sectional view of the solar cell according to the embodiment 1. As shown in FIG. 1A, the solar cell comprises a condensing lens 101 and a solar cell element 102.

Figure 1B:
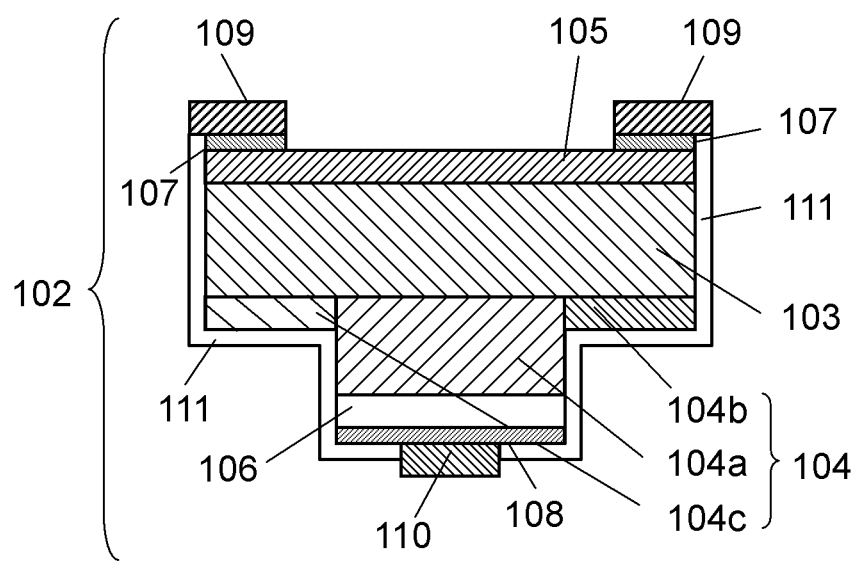
FIG. 1B shows a cross-sectional view of the solar cell element according to the embodiment 1.

As shown in FIG. 1B, the solar cell element 102 comprises an n-type GaAs layer 104, a p-type GaAs layer 103, a p-type window layer 105, an n-side electrode 110, and a p-side electrode 109. The n-type GaAs layer 104, the p-type GaAs layer 103, and the p-type window layer 105 are stacked. A Z-direction denotes a stacking direction. Along the Z-direction, the p-type GaAs layer 103 is interposed between the n-type GaAs layer 104 and the p-type window layer 105.

The p-side electrode 109 is electrically connected with the p-type GaAs layer 103. The n-side electrode 110 is electrically connected with the n-type GaAs layer 104.

It is preferable that an n-type barrier layer 106 and an n-type contact layer 108 are interposed between the n-type GaAs layer 104 and the n-side electrode 110 along the Z-direction. Along the Z-direction, the n-type barrier layer 106 is interposed between the n-type GaAs layer 104 and the n-type contact layer 108. Along the Z-direction, the n-type contact layer 108 is interposed between the n-type barrier layer 106 and the n-side electrode 110.

Along the Z-direction, it is preferable that a p-type contact layer 107 is interposed between the p-type window layer 105 and the p-side electrode 109. The p-side electrode 109, the p-type contact layer 107, the p-type window layer 105, the p-type GaAs layer 103, the n-type GaAs layer 104, the n-type barrier layer 106, the n-type contact layer 108, and the n-side electrode 110 are electrically connected in this order.

As shown in FIG. 1B, the n-type GaAs layer 104 is divided into a center part 104a, a first peripheral part 104b, and a second peripheral part 104c. The center part 104a is interposed between the first peripheral part 104b and the second peripheral part 104c along an X-direction. The X-direction is orthogonal to the Z-direction.

Figure 2:
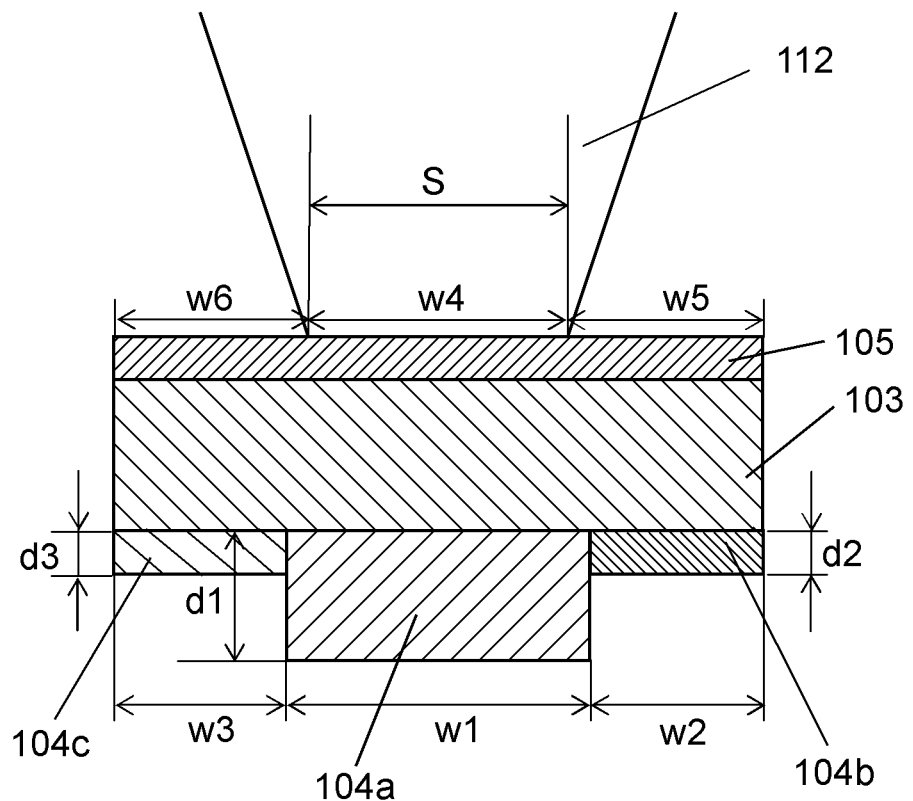
FIG. 2 shows a cross-sectional exploded view of the solar cell element according to the embodiment 1.

As shown in FIG. 2, the thickness d1 of the center part 104a is greater than the thickness d2 of the first peripheral part 104b and than the thickness d3 of the second peripheral part 104c. When the thickness d1 is the same as the thickness d2 and the thickness d3, the higher conversion efficiency is not achieved (see the comparative examples 1 and 3, which are described later).

In the embodiment 1, the thickness d2 is not less than 1 nanometer and not more than 4 nanometers. When the thickness d2 is less than 1 nanometer, the higher conversion efficiency is not achieved (see the comparative example 10, which is described later). When the thickness d2 is more than 4 nanometers, the higher conversion efficiency is not achieved (see the comparative examples 7 to 9, which are described later). Similarly, the thickness d3 is also not less than 1 nanometer and not more than 4 nanometers.

Figure 6A:
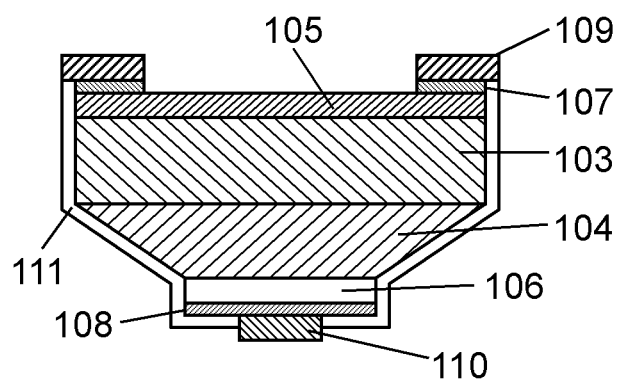
FIG. 6A shows a cross-sectional view of the solar cell element according to the comparative example 4.
Figure 6B:
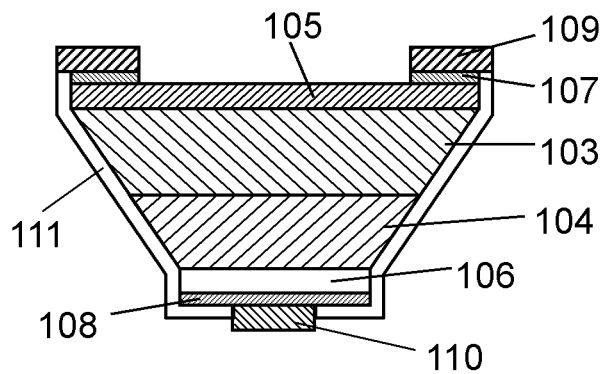
FIG. 6B shows a cross-sectional view of the solar cell element according to the comparative example 5.
Figure 7:
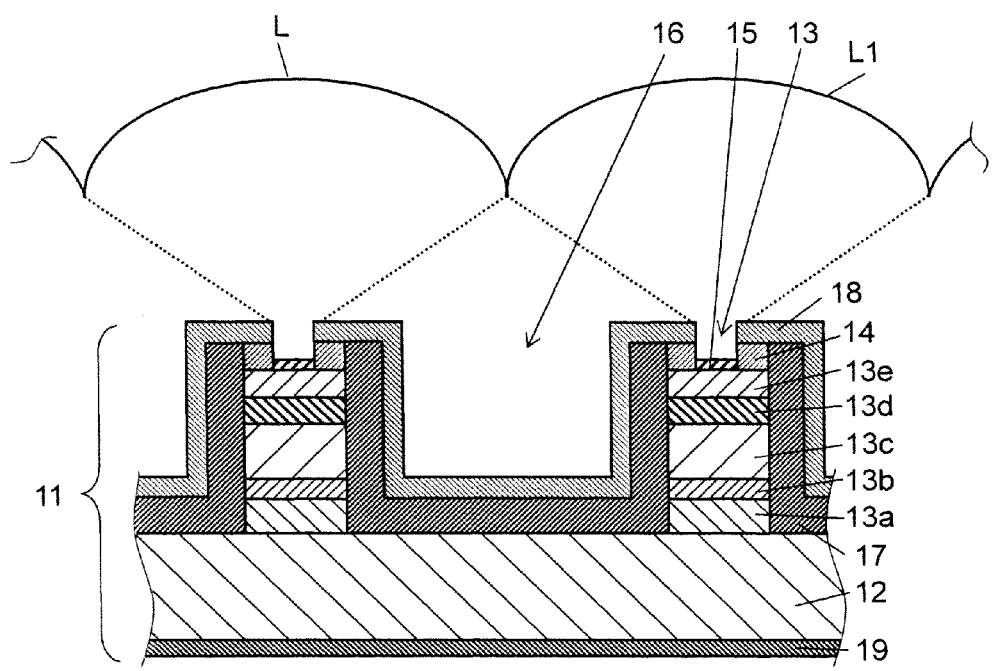
FIG. 7 shows a cross-sectional view of the conventional solar cell.

The first peripheral part 104b has a shape of a layer. As shown in FIG. 6A and FIG. 6B, the first peripheral part 104b must not have a shape of a taper. This is because the higher conversion efficiency is not achieved (see the comparative examples 4 and 5, which are described later). Similarly, the second peripheral part 104c also has a shape of a layer.

As shown in FIG. 2, the center part 104a has a width of w1. The first peripheral part 104b has a width of w2. The second peripheral part 104c has a width of w3.

The value of w2 is 0.1 micrometer or more. When the value of w2 is less than 0.1 micrometer, the conversion efficiency is decreased. For the same reason, the value of w3 is 0.1 micrometer or more. See the examples 4 and 5 and the comparative example 10, which are described later.

Accordingly, the following inequation set (I) is required to be satisfied in the embodiment 1.

d2<d1, d3<d1, 1 nanometer≤d2≤4 nanometers, 1 nanometer≤d3≤4 nanometers, 100 nanometers≤w2, and 100 nanometers≤w3    (I)

As described above, the value of d1 represents a thickness of the center part 104a along the Z-direction.

The value of d2 represents a thickness of the first peripheral part 104b along the Z-direction.

The value of d3 represents a thickness of the second peripheral part 104c along the Z-direction.

The value of w2 represents a width of the first peripheral part 104b along the X-direction.

The value of w3 represents a width of the second peripheral part 104c along the X-direction.

The obverse surface of the condensing lens 101 is irradiated with light. This is described in more detail in the step (b), which is described later. Sunlight is preferred.

The reverse surface of the condensing lens 101 is preferably in contact with the solar cell element 102. The light is focused onto the p-type window layer 105 by the condensing lens 101.

It is preferable that the condensing lens 101 has a diameter of 2 millimeters to 10 millimeters, a thickness of 1 millimeter to 5 millimeters, and a refractive index of 1.1 to 2.0.

The material of the condensing lens 101 is not limited. An example of the material of the condensing lens 101 is glass or resin.

The p-type window layer 105 is made of a p-type compound semiconductor having a lattice constant close to that of GaAs and having a wider bandgap than GaAs. An example of the material of the p-type window layer 105 is p-type InGaP or p-type AlGaAs.

The n-type barrier layer 106 is made of an n-type compound semiconductor having a lattice constant close to that of GaAs and having a wider bandgap than GaAs. An example of the material of the n-type barrier layer 106 is n-type InGaP or n-type AlGaAs.

The material of the p-type contact layer 107 is not limited, as long as ohmic contacts are formed in the interface with the p-type window layer 105 and in the interface with the p-side electrode 109. An example of the material of the p-type contact layer 107 is p-type GaAs.

The material of the n-type contact layer 108 is not limited, as long as ohmic contacts are formed in the interface with the n-type barrier layer 106 and in the interface with the n-side electrode 110. An example of the material of the n-type contact layer 108 is n-type GaAs.

As shown in FIG. 1B, the sides of the layers 103 to 108 are preferably covered with an insulating film 111. An example of the material of the insulating film 111 is non-doped InGaP, silicon dioxide, or silicon nitride.

Figure 4:
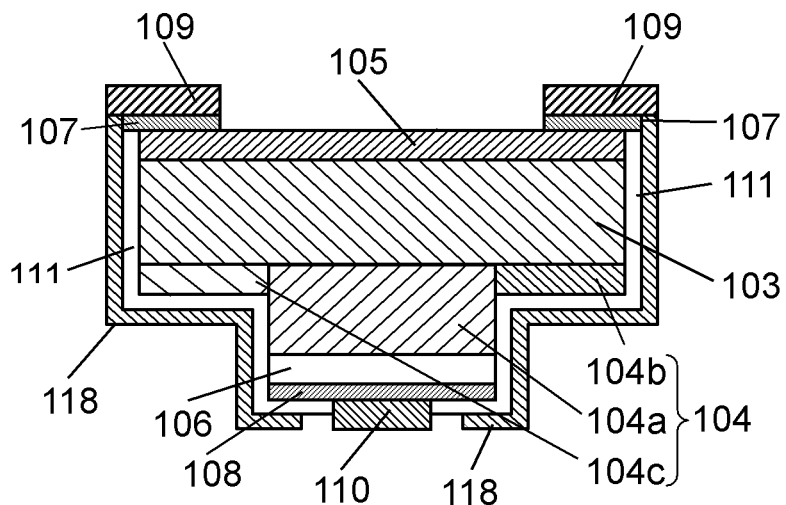
FIG. 4 shows a cross-sectional view of the solar cell element according to the embodiment 1.
Figure 5:
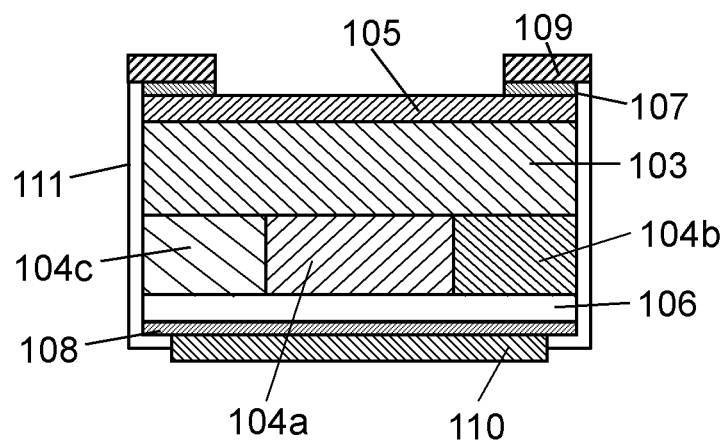
FIG. 5 shows a cross-sectional view of the solar cell element according to the comparative example 1.

When the insulating film 111 is used, as shown in FIG. 4, the insulating film 111 is covered with a metal film 118. The metal film 118 improves the heat radiation property of the solar cell element 102.

It is preferred that the metal film 118 is electrically connected with the p-side electrode 109 and that the metal film 118 and the n-side electrode 110 are exposed on one surface (in FIG. 4, the bottom surface).

(Method for Fabricating Solar Cell Element 102)

A method for fabricating a solar cell element 102 is described below with reference to FIGS. 3A to 3G.

Figure 3A:
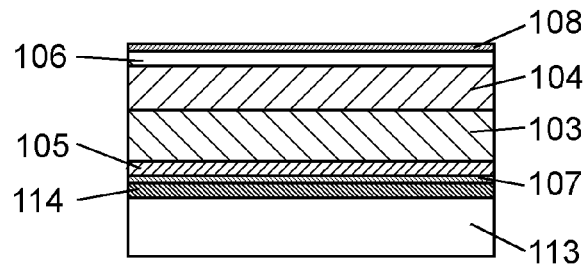
FIG. 3A shows a fabricating step of the solar cell element according to the embodiment 1.

First, as shown in FIG. 3A, a sacrificial layer 114, the p-type contact layer 107, the p-type window layer 105, the p-type GaAs layer 103, the n-type GaAs layer 104, the n-type barrier layer 106, and the n-type contact layer 108 are formed in this order on the surface of a GaAs substrate 113 by a known semiconductor growth method such as a molecular beam epitaxy method or a metal organic chemical vapor deposition method (hereinafter, referred to as an "MOCVD method"). The sacrificial layer 114 has a lattice constant close to that of GaAs. The sacrificial layer 114 is a layer for being etched selectively against GaAs. An example of the material of the sacrificial layer 114 is AlAs or InGaP.

Figure 3B:
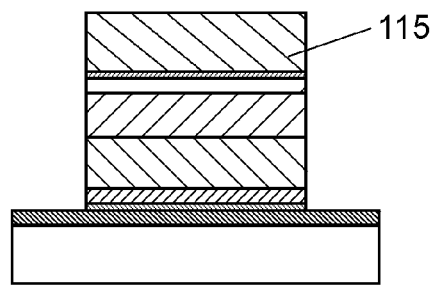
FIG. 3B shows a fabricating step of the solar cell element according to the embodiment 1.

Next, as shown in FIG. 3B, a first mask 115 is formed on the n-type contact layer 108. The n-type contact layer 108, the n-type barrier layer 106, the n-type GaAs layer 104, the p-type GaAs layer 103, the p-type window layer 105, and the p-type contact layer 107 are etched by dry-etching with use of the first mask 115. The width of the first mask 115 is equal to the sum of (w1+w2+w3) shown in FIG. 2. In the dry-etching, a mixed gas of $BCl_3$ and $SF_6$ may be used.

Figure 3C:
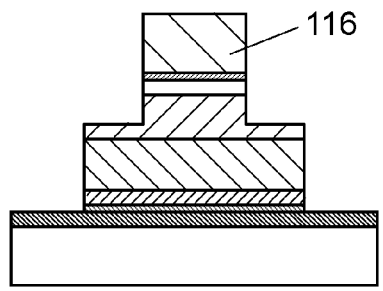
FIG. 3C shows a fabricating step of the solar cell element according to the embodiment 1.

As shown in FIG. 3C, a second mask 116 is formed on the n-type contact layer 108. The second mask 116 has a smaller width than the first mask 115. This width of the second mask 116 is the same as the width of w1 shown in FIG. 2. With use of the second mask 116, the n-type contact layer 108 and the n-type barrier layer 106 are etched. Furthermore, the upper portion of a peripheral part of the n-type GaAs layer 104 is etched. The etching depth of the n-type GaAs layer 104 is equal to the thickness d1−d3 shown in FIG. 2.

Figure 3D:
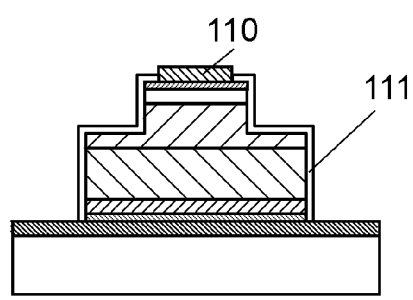
FIG. 3D shows a fabricating step of the solar cell element according to the embodiment 1.

As shown in FIG. 3D, the second mask 116 is removed. The n-side electrode 110 and the insulating film 111 are formed. An example of forming the n-side electrode 110 is a sputtering method or an electron beam deposition technique. An example of forming the insulating film 111 is a chemical vapor deposition method.

Figure 3E:
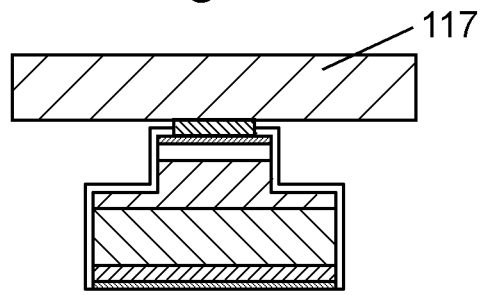
FIG. 3E shows a fabricating step of the solar cell element according to the embodiment 1.

As shown in FIG. 3E, a base substrate 117 is fixed to the n-side electrode 110. The GaAs substrate 113 and the sacrificial layer 114 are removed by etching. An example of the base substrate 117 is a silicon substrate or a glass substrate. A wax or an adhesive sheet may be interposed between the n-side electrode 110 and the base substrate 117 optionally.

Figure 3F:
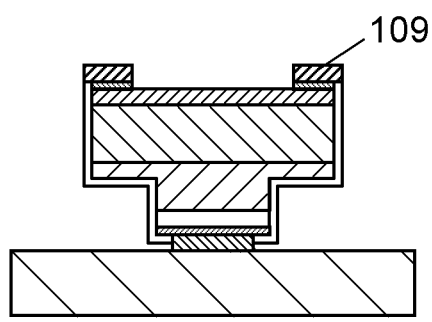
FIG. 3F shows a fabricating step of the solar cell element according to the embodiment 1.

As shown in FIG. 3F, the p-side electrode 109 is formed on the p-type contact layer 107. Furthermore, a part of the p-type contact layer 107 which is not in contact with the p-side electrode 109 is removed by etching. An example of forming the p-side electrode 109 is a sputtering method or an electron beam deposition technique.

Figure 3G:
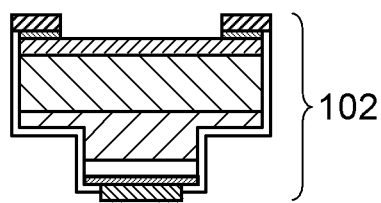
FIG. 3G shows a fabricating step of the solar cell element according to the embodiment 1.

Finally, as shown in FIG. 3G, the base substrate 117 is removed. Thus, the solar cell element 102 is obtained. As shown in FIG. 1A, the obtained solar cell element 102 is fixed to the condensing lens 101. Thus, the solar cell is obtained.

Step (b)

In the step (b), the p-type window layer 105 is irradiated with the light through the condensing lens 101 to generate a potential difference between the n-side electrode 110 and the p-side electrode 109. As shown in FIG. 2, a region S of the p-type window layer 105 is irradiated with the light.

The present inventors discovered that the following inequation set (II) is required to be satisfied in the step (b).

$$w4 \leq w1 \tag{II}$$

As described above, the value of w1 represents the width of the center part 104a along the X-direction.

The value of w4 represents a width of the region S along the X-direction.

When seen along the Z-direction, the center part 104a overlaps with the region S.

In the case where the inequation set (II) is not satisfied, the higher conversion efficiency is not achieved (see the comparative example 4).

As shown in FIG. 2, when the n-type GaAs layer 104 has the same width as the p-type window layer 105, the width of w1 is equal to or greater than the width of w4. Specifically, if the following equation: (w1+w2+w3)=(w4+w5+w6) is satisfied, the width of w5 is equal to or greater than the width of w2, and the width of w6 is equal to or greater than the width of w3. Both of w5 and w6 correspond to the part which is not irradiated with the light.

EXAMPLES

The present invention is described in more detail by the following examples.

Example 1

In the example 1, the solar cell element 102 shown in FIG. 2 was fabricated by the method shown in FIGS. 3A to 3G.

Table 1 shows the composition and the thickness of each layer in the solar cell element 102 according to the example 1.

TABLE 1

| Layers | Composition | Dopant Element | Concentration | Thickness (micrometer) |
|---|---|---|---|---|
| n-type contact layer 108 | GaAs | Te | $2.0 \times 10^{19}$ | 0.02 |
| n-type barrier layer 106 | InGaP | Si | $3.0 \times 10^{17}$ | 0.1 |
| n-type GaAs layer 104 | GaAs | Si | $1.0 \times 10^{18}$ | 2.5 |

TABLE 1-continued

| Layers | Composition | Dopant Element | Concentration | Thickness (micrometer) |
|---|---|---|---|---|
| p-type GaAs layer 103 | GaAs | Zn | $3.0 \times 10^{17}$ | 0.5 |
| p-type window layer 105 | InGaP | Zn | $3.0 \times 10^{17}$ | 0.1 |
| p-type contact layer 107 | GaAs | Zn | $1.0 \times 10^{19}$ | 0.02 |
| Sacrificial layer 114 | AlAs | — | — | 0.1 |
| Substrate 113 | GaAs | — | — | 500 |

In the example 1, d1 to d3 and w1 to w3 were described as below.
 d1: 2.5 micrometers
 d2: 4 nanometers
 d3: 4 nanometers
 w1: 90 micrometers
 w2: 5 micrometers
 w3: 5 micrometers The condensing lens 101 was 4 millimeters square and had a thickness of 3 mm. The condensing lens 101 had a focus spot of 80 micrometers square.

The solar cell according to the example 1 was fabricated as below.

First, as shown in FIG. 3A, the layers 104 to 114 shown in Table 1 were grown on the GaAs substrate 113 by an MOCVD method.

Next, as shown in FIG. 3B, a square resist film 115 having 100 micrometers square was formed on the n-type contact layer 108 by photolithography. Using this resist film 115 as a first mask, the n-type contact layer 108, the n-type barrier layer 106, the n-type GaAs layer 104, the p-type GaAs layer 103, the p-type window layer 105, and the p-type contact layer 107 were removed by ICP plasma etching with use of a mixed gas of $BCl_3$ and $SF_6$. Thus, a pattern having 100 micrometers square was formed.

After etching, the first mask was removed with a resist stripper liquid. After removed, a square resist film 116 having 90 micrometers square was formed on the n-type contact layer 108. The center of the resist film 116 corresponded with the center of the resist film 115.

Using this resist film 116 as a second mask, the n-type contact layer 108 and the n-type barrier layer 106 were etched. Furthermore, as shown in FIG. 3C, almost all of the peripheral part of the n-type GaAs layer 104 was etched in such a manner that the peripheral part of the n-type GaAs layer was left slightly. A mixed solution of phosphoric acid and hydrogen peroxide was used to etch the n-type contact layer 108 and the n-type GaAs layer 104. Hydrochloric acid was used to etch the n-type barrier layer 106.

After etching, the thickness of the remaining peripheral part of the n-type GaAs layer 104 was measured with a transmission electron microscope. The thickness was 4 nanometers.

The second mask was removed with a detachment liquid. After removed, as shown in FIG. 3D, a titanium film with a thickness of 50 nanometers and a gold film with a thickness of 250 nanometers were stacked on the n-type contact layer 108 to form the n-side electrode 110 with use of an electron beam deposition device.

Next, as shown in FIG. 3D, an insulating film 111 made of SiN with a thickness of 400 nanometers was formed with use of a plasma chemical vapor deposition device.

Next, wax was applied with a spin coater to the surface where the n-side electrode 110 was formed. After the wax was dried, as shown in FIG. 3E, the n-side electrode 110 was fixed to the base substrate 117 made of glass.

After fixed, the GaAs substrate 113 was removed with use of a mixture of citric acid and hydrogen peroxide. Subsequently, the sacrificial layer 114 was removed with use of buffered hydrofluoric acid to expose the p-type contact layer 107. Thus, the structure shown in FIG. 3E was obtained.

As shown in FIG. 3F, a titanium film having a thickness of 50 nanometers, a platinum film having a thickness of 150 nanometers, and a gold film having a thickness of 250 nanometers were formed in this order on the p-type contact layer 107 to form the p-side electrode 109 with use of an electron beam deposition device.

After the p-side electrode 109 was formed, the wax was dissolved with isopropanol to remove the base substrate 117. Thus, the solar cell element 102 shown in FIG. 3G was obtained.

The obtained solar cell element 102 was attached to the condensing lens 101 in such a manner that the center of the focus position of the condensing lens 101 corresponded with the center of the solar cell element 102. In this manner, the solar cell according to the example 1 was obtained.

The solar cell according to the example 1 was irradiated with sunlight under the condition that w4=90 micrometers and w5=w6=5 micrometers. The volt-ampere characteristics of the solar cell according to the example 1 were measured, and the conversion efficiency was calculated. Table 2 shows them with the data of the examples 2 to 8 and the comparative examples 1 to 14.

The conversion efficiency was calculated according to the following equation (I):

(Conversion efficiency)=(Maximum output value from the solar cell)/(Energy of the sunlight)  (Equation I)

The maximum output value described in the above-mentioned equation (I) denotes the maximum value of the output value defined by the following equation (II):

(Output value)=(Current density obtained from the solar cell)·(Bias voltage obtained from the solar cell)

For more detail, see the pages 11 to 13 disclosed in Non-Patent Literature 1, such as Jenny Nelson, "The Physics of Solar Cells", World Scientific Pub. Co. Inc.

TABLE 2

| | w1 | w2 (=w3) | d1 | d2 (=d3) | w4 | w5 (=w6) | Conversion Efficiency |
|---|---|---|---|---|---|---|---|
| Example 1 | 90 | 5 | 2.5 | 0.004 | 90 | 5 | 25.14 |
| Example 2 | 90 | 5 | 2.5 | 0.002 | 90 | 5 | 25.18 |
| Example 3 | 90 | 5 | 2.5 | 0.001 | 90 | 5 | 25.2 |
| Example 4 | 99.8 | 0.1 | 2.5 | 0.004 | 90 | 5 | 24.85 |
| Example 5 | 99 | 0.5 | 2.5 | 0.004 | 90 | 5 | 24.93 |
| Example 6 | 90 | 5 | 2.5 | 0.004 | 86 | 7 | 25.12 |
| Example 7 | 80 | 10 | 2.5 | 0.004 | 80 | 10 | 24.72 |
| Example 8 | 80 | 10 | 2.5 | 0.004 | 76 | 12 | 24.55 |
| Comparative Example 1 | 90 | 5 | 2.5 | 2.5 | 100 | 0 | 20.65 |
| Comparative Example 2 | 90 | 5 | 2.5 | 2.5 | 90 | 5 | 22.86 |
| Comparative Example 3 | 90 | 5 | 2.5 | 0.004 | 100 | 0 | 19.86 |
| Comparative Example 4 | — | — | — | — | 90 | 5 | 22.18 |

TABLE 2-continued

| | w1 | w2 (= w3) | d1 | d2 (= d3) | w4 | w5 (= w6) | Conversion Efficiency |
|---|---|---|---|---|---|---|---|
| Comparative Example 5 | — | — | — | — | 90 | 5 | 22.42 |
| Comparative Example 6 | 90 | 5 | 2.5 | 0.1 | 90 | 5 | 22.89 |
| Comparative Example 7 | 90 | 5 | 2.5 | 0.01 | 90 | 5 | 23.07 |
| Comparative Example 8 | 90 | 5 | 2.5 | 0.005 | 90 | 5 | 23.75 |
| Comparative Example 9 | 90 | 5 | 2.5 | 0 | 90 | 5 | 23.08 |
| Comparative Example 10 | 99.9 | 0.05 | 2.5 | 0.004 | 90 | 5 | 22.84 |
| Comparative Example 11 | 90 | 5 | 2.5 | 0.004 | 98 | 1 | 20.98 |
| Comparative Example 12 | 90 | 5 | 2.5 | 0.004 | 94 | 3 | 23.36 |
| Comparative Example 13 | 80 | 10 | 2.5 | 0.004 | 88 | 6 | 19.4 |
| Comparative Example 14 | 80 | 10 | 2.5 | 0.004 | 84 | 8 | 22.47 |

Example 2

The experiment identical to that of the example 1 was performed except that d2=2 nanometers.

Example 3

The experiment identical to that of the example 1 was performed except that d2=1 nanometer.

Example 4

The experiment identical to that of the example 1 was performed except that w1=99.8 micrometers and w2=w3=0.1 micrometer.

Example 5

The experiment identical to that of the example 1 was performed except that w1=99 micrometers and w2=w3=0.5 micrometers.

Example 6

The experiment identical to that of the example 1 was performed except that w4=86 micrometers and w5=w6=7 micrometers.

Example 7

The experiment identical to that of the example 1 was performed except that w1=80 micrometers, w2=w3=10 micrometers, w4=80 micrometers, and w5=w6=10 micrometers.

Example 8

The experiment identical to that of the example 1 was performed except that w1=80 micrometers, w2=w3=10 micrometers, w4=76 micrometers, and w5=w6=12 micrometers.

Comparative Example 1

The experiment identical to that of the example 1 was performed except that d2=d3=2.5 micrometers and w4=100 micrometers.

Comparative Example 2

The experiment identical to that of the example 1 was performed except that d2=d3=2.5 micrometers.

Comparative Example 3

The experiment identical to that of the example 1 was performed except that w4=100 micrometers.

Comparative Example 4

The experiment identical to that of the example 1 was performed except that the p-type GaAs layer 103 was formed by a wet-etching technique, instead of the ICP plasma etching, which is a dry etching, so as to obtain the solar cell shown in FIG. 6A.

Comparative Example 5

The experiment identical to that of the example 1 was performed except that the p-type GaAs layer 103 and the n-type GaAs layer 104 were formed by a wet-etching technique to obtain the solar cell shown in FIG. 6B.

Comparative Example 6

The experiment identical to that of the example 1 was performed except that d2=d3=0.1 micrometers.

Comparative Example 7

The experiment identical to that of the example 1 was performed except that d2=d3=0.01 micrometers.

Comparative Example 8

The experiment identical to that of the example 1 was performed except that d2=d3=0.005 micrometers.

Comparative Example 9

The experiment identical to that of the example 1 was performed except that d2=d3=0 micrometers.

Comparative Example 10

The experiment identical to that of the example 1 was performed except that w1=99.9 micrometers and w2=w3=0.05 micrometers.

Comparative Example 11

The experiment identical to that of the example 1 was performed except that w4=98 micrometers and w5=w6=1 micrometer.

Comparative Example 12

The experiment identical to that of the example 1 was performed except that w4=94 micrometers and w5=w6=3 micrometers.

Comparative Example 13

The experiment identical to that of the example 1 was performed except that w1=80 micrometers, w2=w3=10 micrometers, w4=88 micrometers, and w5=w6=6 micrometers.

Comparative Example 14

The experiment identical to that of the example 1 was performed except that w1=80 micrometers, w2=w3=10 micrometers, w4=84 micrometers, and w5=w6=8 micrometers.

As is clear from Table 2, when the following inequation set: d2<d1, d3<d1, 1 nanometer≤d2≤4 nanometers, 1 nanometer≤d3≤4 nanometers, 100 nanometers≤w2, 100 nannometers≤w3, and w4≤w1 is satisfied, a high conversion efficiency of 24% or more is achieved.

The examples 1 to 8 and the comparative examples 1 and 2 show that it is necessary that the following inequation set: d2<d1 and d3<d1 is satisfied.

The examples 1 to 3 and the comparative examples 6 to 9 show that it is necessary that the following inequation set: 1 nanometer≤d2≤4 nanometers and 1 nanometer≤d3≤4 nanometers is satisfied.

The examples 4 and 5 and the comparative example 10 show that it is necessary that the following inequation set: 100 nanometers≤w2 and 100 nannometers≤w3 is satisfied.

The examples 1, 6 to 8 and the comparative examples 11 to 14 show that it is necessary that the following inequation: w4≤w1 is satisfied.

INDUSTRIAL APPLICABILITY

The present invention provides a solar cell with higher conversion efficiency.

REFERENCE SIGNS LIST

| | |
|---|---|
| 101 | lens |
| 102 | solar cell element |
| 103 | p-type GaAs layer |
| 104 | n-type GaAs layer |
| 104a | center part |
| 104b | first peripheral part |
| 104c | second peripheral part |
| 105 | p-type window layer |
| 106 | n-type barrier layer |
| 107 | p-type contact layer |
| 108 | n-type contact layer |
| 109 | p-side electrode |
| 110 | n-side electrode |
| 111 | insulating film |
| 112 | sunlight |
| 113 | substrate |
| 114 | sacrificial layer |
| 115 | first mask |
| 116 | second mask |
| 117 | base substrate |
| 118 | metal film |

The invention claimed is:

1. A method for generating electric power with use of a solar cell, the method comprising steps of:
    (a) preparing the solar cell comprising a condensing lens and a solar cell element, wherein
    the solar cell element comprises an n-type GaAs layer, a p-type GaAs layer, a p-type window layer, an n-side electrode, and a p-side electrode;
    a Z-direction denotes the direction of the normal line of the p-type GaAs layer;
    an X-direction denotes a direction orthogonal to the Z-direction,
    the n-type GaAs layer, the p-type GaAs layer, and the p-type window layer are stacked along the Z-direction;
    the p-type GaAs layer is interposed between the n-type GaAs layer and the p-type window layer along the Z-direction;
    the p-side electrode is electrically connected with the p-type GaAs layer;
    the n-side electrode is electrically connected with the n-type GaAs layer;
    the n-type GaAs layer is divided into a center part, a first peripheral part, and a second peripheral part;
    the center part is interposed between the first peripheral part and the second peripheral part along the X-direction;
    the first peripheral part and the second peripheral part have a shape of a layer,
    the following inequation set (I) is satisfied:

$$d2<d1, d3<d1, 1\ \text{nanometer}\leq d2\leq 4\ \text{nanometers}, 1\ \text{nanometer}\leq d3\leq 4\ \text{nanometers}, 100\ \text{nanometers}\leq w2, \text{and}\ 100\ \text{nanometers}\leq w3 \quad \text{(I)};$$

wherein
    d1 represents a thickness of the center part along the Z-direction;
    d2 represents a thickness of the first peripheral part along the Z-direction;
    d3 represents a thickness of the second peripheral part along the Z-direction;
    w2 represents a width of the first peripheral part along the X-direction; and
    w3 represents a width of the second peripheral part along the X-direction; and
    (b) irradiating a region S which is included in the surface of the p-type window layer through the condensing lens with light in such a manner that the following inequation (II) is satisfied so as to generate a potential difference between the n-side electrode and the p-side electrode:

$$w4\leq w1 \quad \text{(II)};$$

wherein
    w1 represents a width of the center part along the X-direction;
    w4 represents a width of the region S along the X-direction in the cross-sectional view which includes the Z-direction; and
    the first center part overlaps the region S when seen from the Z-direction.

2. The method according to claim 1, wherein the width of the n-type GaAs layer is equal to the width of the p-type window layer.

3. The method according to claim 1, wherein the solar cell element further comprises an n-type barrier layer interposed between the n-side electrode and the center part.

4. The method according to claim 1, wherein the solar cell element further comprises an n-type contact layer interposed between the n-side electrode and the center part.

5. The method according to claim 1, wherein the solar cell element further comprises a p-type contact layer interposed between the p-side electrode and the p-type GaAs layer.

6. The method according to claim 1, wherein the sides of the n-type GaAs layer, the p-type GaAs layer, and the p-type window layer are covered with an insulating film.

* * * * *